United States Patent
Bhaumik et al.

(10) Patent No.: US 6,429,988 B1
(45) Date of Patent: *Aug. 6, 2002

(54) SYSTEM AND METHOD FOR CALIBRATING A CORNER FREQUENCY OF A TUNABLE FILTER USING ADC CODE DIFFERENCE METHOD

(75) Inventors: Jaydip Bhaumik, Rochester; Chad Edward Mitchell, Kasson; Rick Allen Philpott; Raymond Alan Richetta, both of Rochester, all of MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/667,905

(22) Filed: Sep. 22, 2000

(51) Int. Cl.$^7$ ................................................. G11B 5/09
(52) U.S. Cl. ............................ 360/46; 360/67; 360/65; 360/68; 360/32
(58) Field of Search .............................. 360/46, 67, 65, 360/68, 32; 324/212, 226; 375/229, 230, 232, 345; 708/322, 323

(56) References Cited

U.S. PATENT DOCUMENTS

| | | | | |
|---|---|---|---|---|
| 4,940,977 A | * | 7/1990 | Mandell | 341/143 |
| 5,451,949 A | * | 9/1995 | Gundry | 341/143 |
| 5,463,603 A | * | 10/1995 | Petersen | 360/61 |
| 5,642,244 A | * | 6/1997 | Okada et al. | 360/61 |
| 6,003,051 A | * | 12/1999 | Okazaki | 360/46 |

* cited by examiner

Primary Examiner—Alan T. Faber
(74) Attorney, Agent, or Firm—Joan Pennington

(57) ABSTRACT

A system and method are provided for calibrating a corner frequency of a tunable filter using an ADC code difference method. A method for calibrating a corner frequency of a tunable filter in a direct access storage device includes generating a signal having a frequency within a pass band of the tunable filter to be passed to the tunable filter. The gain of the signal is adjusted to a first threshold level. The corner frequency of the signal is shifted to a second threshold level, whereby the corner frequency of the tunable filter is calibrated at a desired frequency. A system for calibrating a corner frequency of a tunable filter in a direct access storage device includes calibrate control logic coupled to a tunable filter. A signal source generating a signal having a frequency within a pass band of the tunable filter to be passed to the tunable filter is coupled to the tunable filter by a variable gain amplifier. An analog-to-digital converter (ADC) is coupled to the tunable filter. The ADC produces a digitized signal in response to receiving the signal from the filter. The calibrate control logic adjusts a gain of the digitized signal to a first threshold level. The calibrate control logic shifts the corner frequency of the digitized signal to a second threshold level, whereby the corner frequency of the tunable filter is calibrated at a desired frequency. The first threshold level is set to a first ADC code and the second threshold level is set to a second ADC code. The second threshold level, second ADC code is set to the equivalent code of any given attenuation setting, for example, about 3 dB less than the first threshold level, first ADC code.

16 Claims, 9 Drawing Sheets

SYSTEM AND METHOD FOR CALIBRATING A CORNER FREQUENCY OF A TUNABLE FILTER USING ADC CODE DIFFERENCE METHOD

RELATED APPLICATION

This application is related to patent application (RO999-219) Ser. No. 09/570,277 filed May 12, 2000 to Chad E. Mitchell et al., entitled "SYSTEM AND METHOD FOR CALIBRATING A CORNER FREQUENCY OF A TUNABLE FILTER EMPLOYED IN A READ CHANNEL OF A DATA STORAGE SYSTEM".

FIELD OF THE INVENTION

The present invention relates generally to the data processing field, and more particularly, relates to a system and method for calibrating a corner frequency of a tunable filter using an ADC code difference method in a direct access storage device.

DESCRIPTION OF THE RELATED ART

Direct access storage devices (DASDs) often incorporating stacked, commonly rotated rigid magnetic disks are used for storage of data in magnetic form on the disk surfaces. Data is recorded in concentric, radially spaced data information tracks arrayed on the surfaces of the disks. Transducer heads driven in a path toward and away from the drive axis write data to the disks and read data from the disks. Typically servo information is provided on one or more disk surfaces for reading by the transducer heads for accurately and reliably positioning transducer heads on the disk surfaces at a specific location to read and write data.

As channel speeds go faster, conventional arrangements of circuit functions can be a limiting factor in overall performance. In the design of new DASDs, the performance requirements can be more demanding than the data channel can deliver with traditional architectures.

A need exist for an effective mechanism for calibrating a corner frequency of a tunable filter, such as a continuous time filter (CTF) used in the DASD data channel. Corner frequency calibration (CFC) takes the place of fuse trims in older technologies. Corner frequency calibration leads to tremendous test and technology savings over fuse trims.

SUMMARY OF THE INVENTION

A principal object of the present invention is to provide a system and method for calibrating a corner frequency of a tunable filter using an ADC code difference method. Other important objects of the present invention are to provide such system and method for calibrating a corner frequency of a tunable filter using an ADC code difference method substantially without negative effect; and that overcome many of the disadvantages of prior art arrangements.

In brief, a system and method are provided for calibrating a corner frequency of a tunable filter using an ADC code difference method. A method for calibrating a corner frequency of a tunable filter in a direct access storage device includes generating a signal having a frequency within a pass band of the tunable filter to be passed to the tunable filter. The gain of the signal is adjusted to a first threshold level. The corner frequency of the signal is shifted to a second threshold level, whereby the corner frequency of the tunable filter is calibrated at a desired frequency.

A system for calibrating a corner frequency of a tunable filter in a direct access storage device includes calibrate control logic coupled to a tunable filter. A signal source generating a signal having a frequency within a pass band of the tunable filter to be passed to the tunable filter is coupled to the tunable filter by a variable gain amplifier. An analog-to-digital converter (ADC) is coupled to the tunable filter. The ADC produces a digitized signal in response to receiving the signal from the filter. The calibrate control logic adjusts a gain of the digitized signal to a first threshold level. The calibrate control logic shifts the corner frequency of the digitized signal to a second threshold level, whereby the corner frequency of the tunable filter is calibrated at a desired frequency.

In accordance with features of the invention, the first threshold level is set to a first ADC code and the second threshold level is set to a second ADC code. The second threshold level, second ADC code is set to the equivalent code of any given attenuation setting, for example, about 3 dB less than the first threshold level, first ADC code.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1A:
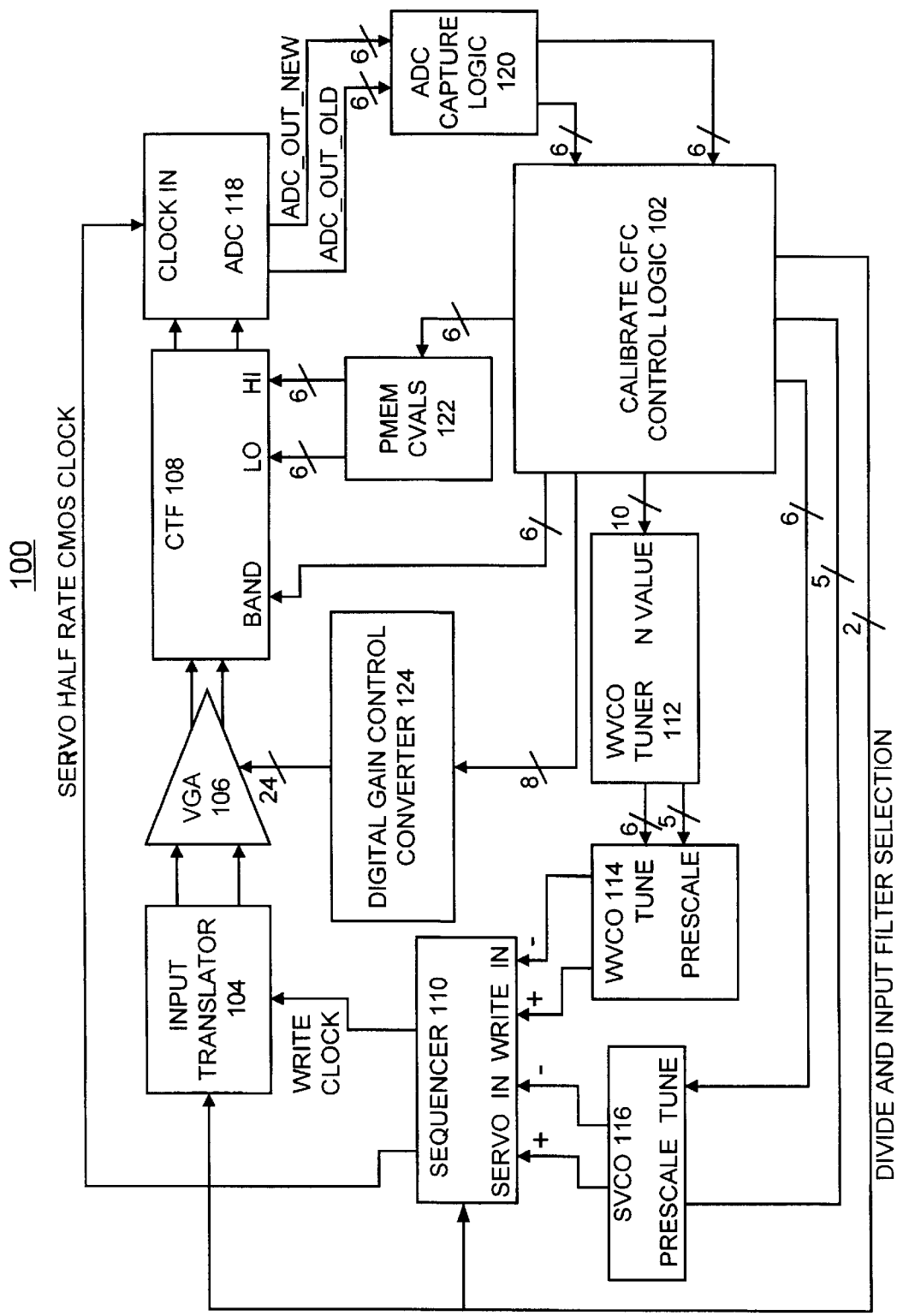
FIG. 1A is a block diagram representation illustrating a direct access storage device (DASD) system for implementing methods for calibrating a corner frequency of a tunable filter in a direct access storage device in accordance with the preferred embodiment.

Having reference now to the drawings, in FIG. 1, there is shown a direct access storage device (DASD) calibration system of the preferred embodiment generally designated by the reference character 100. As shown in FIG. 1, DASD system 100 includes a calibrate corner frequency calibrate (CFC) control logic 102 of the preferred embodiment. Calibrate CFC control logic 102 is arranged for implementing a method for calibrating a corner frequency of a tunable filter. Corner frequency calibration is provided by the calibrate CFC control logic 102 using an ADC code difference method of the preferred embodiment as illustrated and described with respect to FIGS. 3, 4, 5, 6, 7, and 8.

In accordance with features of the invention, an analog-to-digital converter (ADC) is used to measure a selected attenuation of the corner, for example, a 3 dB attenuation of the corner. The gain setup is determined by digital peak detection using a particular ADC code as the detection point, for example a threshold 1 using an ADC code 54. The gain is then held and the corner is reduced until a second ADC code is detected, for example a threshold 2 using an ADC code 48. This second ADC code identifies a signal that is attenuated 3 dB from the signal during the gain setup portion of the calibration. Advantages of the method for calibrating a corner frequency of a tunable filter using an ADC code difference method of the preferred embodiment include the use of digital peak detection using ADC digitized samples; user programmability; and that after initial setup, automatic operation is enabled when calibration is initiated.

As shown in FIG. 1A, an input signal generated by an input translator 104 is applied to a variable gain amplifier (VGA) 106 and the amplified input signal is applied to a continuous time filter (CTF) 108. During normal operation of the DASD, the read signal is applied to the VGA 106 and the amplified read signal is applied to the CTF 108. The input translator 104 is driven by a sequencer 110. Control signals are applied to the input translator 104 by the calibrate CFC control logic 102. A write voltage controlled oscillator (WVCO) tuner 112 converts an N value supplied by a user through the calibrate CFC control logic 102 to set a write voltage controlled oscillator (WVCO) 114 up to the correct frequency to be divided into the desired corner frequency. A servo voltage controlled oscillator (SVCO) 116 provides the proper sampling frequency used by an analog-to-digital converter (ADC) 118. The WVCO 114 is coupled to differential data inputs, write in to the sequencer 110. The SVCO 116 is coupled to differential servo inputs, servo in to the sequencer 110. The output of the CTF is digitized in an ADC 118 and captured by an ADC capture logic 120. Calibrate CFC control logic 102 receives the timed samples, and digitally peak detects the value of the samples and makes an appropriate digital gain adjustment via a digital gain control converter 124 followed by corner trim adjustment via register storage of calibrate values referred to as PMEM CVALS 122. The digital gain control converter 124 provides control signals to the variable gain amplifier 106 responsive to control signals received from the calibrate CFC control logic 102.

Figure 1B:
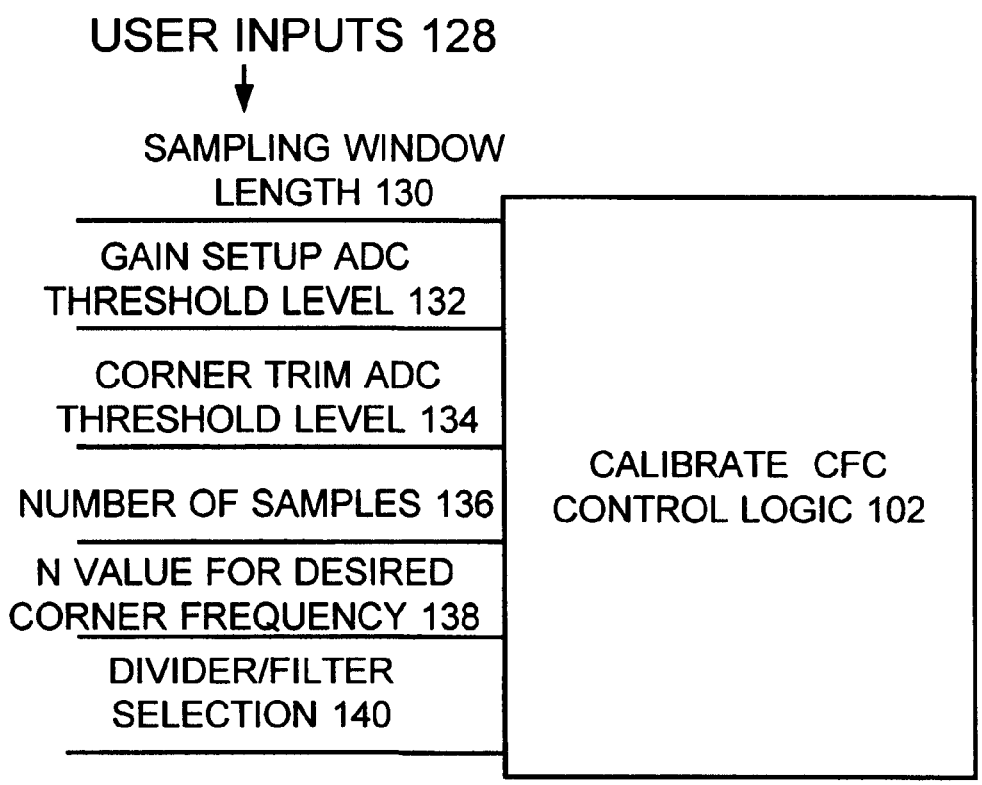
FIG. 1B is a block diagram illustrating the calibrate CFC control logic together with user input selections in accordance with the preferred embodiment.

Referring to FIG. 1B, a plurality of user inputs 128 are applied to the calibrate CFC control logic 102 from the user to set up the CFC calibration. User inputs 128 include a sampling window length 130, a gain setup ADC threshold level 132, a corner trim ADC threshold level 134, a number of samples 136, an N value for desired corner frequency 138, and a divider/filter selection 140. The sampling window length 130 is a specified time in which the digital peak detector of calibrate CFC control logic 102 looks for valid samples. A default value for the sampling window length 130 is, for example, 1024 crystal clocks. The gain setup ADC threshold level 132 is the threshold in the ADC 118 that the peak detector uses to determine if a sample should be captured during the gain setup. The gain setup ADC threshold level 132 is programmable from 32–63 and defaults, for example to ADC Code 54, which is the positive detect level. The negative detect level is calculated from the user inputted positive value as the negative detect level is centered around ADC Code 32, which is no signal. The corner trim ADC threshold level 134 is the threshold in the ADC 118 that the peak detector uses to determine if a sample should be captured during the actual corner trimming. The corner trim ADC threshold level 134 is programmable from 32–63 and defaults, for example to ADC Code 48, which is the positive detect level. The negative detect level is calculated from the user inputted positive value as the negative detect level is centered around ADC Code 32, which is no signal. The number of samples 136 is the number of samples needed to detect a valid threshold crossing. The number of samples 136 is programmable from 16–240 and defaults to 64. The N value for desired corner frequency 138 is an N value input by the user which is used during the appropriate corner calibration. This N value 138 will set up the WVCO 114 to the desired frequency. The user must input all four N values 138 for all four corners. The divider/filter selection 140 is the proper WVCO signal division to attain frequencies lower than 212 MHz. The divider/filter selection 140 is used in conjunction with the N value to attain the proper frequency. The user must input all four divider/filter selections 140 for all four corners.

It should be understood that a set value for a particular disk drive may be provided for one or more of the user inputs 128, instead of user programmable value.

After a user initiates calibration, there is a predefined wait time built in before the calibrate actually starts, for example, a 8191 crystal period wait time. This is needed to initiate a coarse tune in the WVCO tuner 112 which converts the N value to a proper prescale and tune bits to be applied to the WVCO 114. The prescale and tune bits program the WVCO 114 to the proper frequency. During this wait period, all appropriate circuit enables and calibrate control signals are applied and the DASD calibration system 100 will be ready for the calibration to start. The calibrate CFC control logic 102 also sets up the sampling frequency of the ADC 118 during this wait time. Once the WVCO 114 is setup to the proper frequency, the calibrate starts by adjusting the corner cal bits to maximum which pushes the corner out as far as possible. Then the gain setup preamble starts. The signal which the WVCO 114 provides via the sequencer 110 is for example, an emitter coupled logic (ECL) signal which is received and filtered by the VGA 106 and converted to a sinusoidal signal by band pass filtering the input by a selectable bank of capacitors (not shown). The signal has been divided down in the sequencer 110 to the proper frequency before it reaches the VGA 106. This signal then travels through the VGA 106 and CTF 108 and is digitized by the ADC 118 that is sampling using the servo half rate clock. The signal is gain adjusted in the VGA 106 to achieve the proper signal level and is detected by a digital peak detector function of the calibrate CFC control logic 102 after the raw ADC samples are captured in the ADC capture logic 120.

Once the appropriate gain is determined and held, the actual calibrate bits that control the corner frequency of the CTF 108 are manipulated. The cal bits are adjusted until a different ADC threshold equivalent to a defined attenuation, such as a 3 dB attenuation from the gain setup threshold is reached. This effectively moves the corner of the CTF 108 to −3 dB below the passband.

Figure 2A:
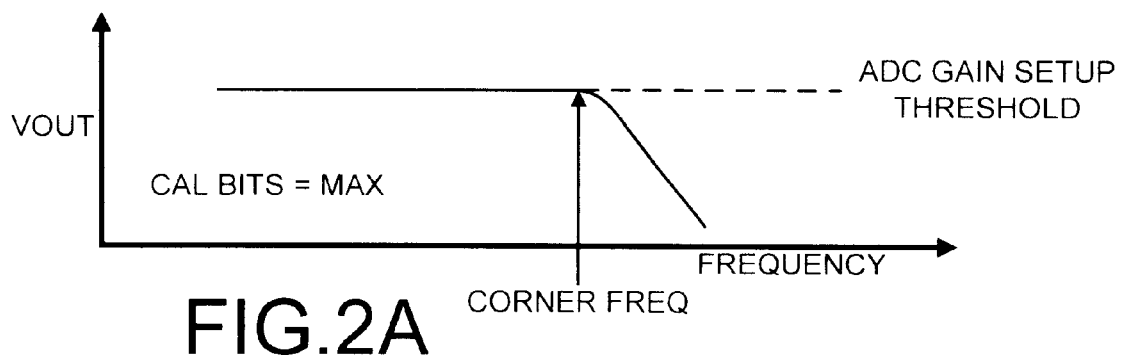
FIGS. 2A and 2B are charts illustrating calibrating a corner frequency of a tunable filter using an ADC code difference method in accordance with the preferred embodiment.
Figure 2B:
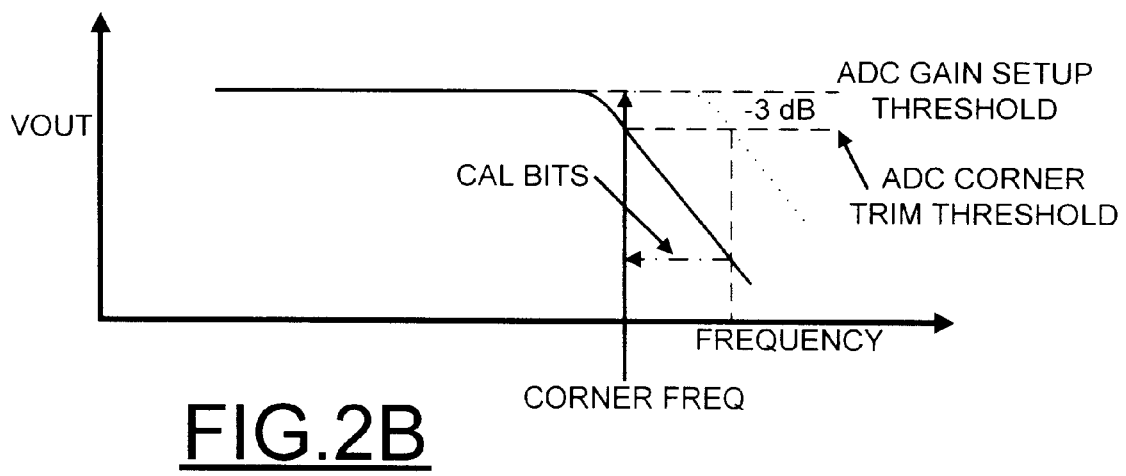

Referring to FIGS. 2A and 2B, the method for corner frequency calibration (CFC) of the preferred embodiment takes the place of fuse trims in older technologies, which leads to tremendous test and technology savings due to the internal nature of the circuitry. The calibrate CFC control logic 102 functions as a calibrate engine and is the control center for CFC. It is through the calibrate CFC control logic 102 that the proper circuits are enabled and setup for use during CFC. CFC uses the entire analog read path to digitize an internally generated signal coupled through input translator 104 and that is gain and frequency controlled. In accordance with the method for corner frequency calibration (CFC) of the preferred embodiment, the desired signal is passed through the CTF 108 when the signal frequency is in the CTF pass band, then adjust the gain of the signal to a desired first threshold 1 at a first ADC code, and finally move the corner frequency back until a second threshold 2 is reached at a second ADC code. This results in the CTF corner being properly calibrated to the desired frequency.

As shown in FIGS. 2A and 2B, gain is set to stop at an ADC gain setup threshold with calibration bits (cal bits) set to a maximum shown in FIG. 2A. The cal bits control the CTF corner frequency. The cal bits are adjusted until a different ADC threshold, for example, equivalent to a 3 dB attenuation from the gain setup threshold, or other selected attenuation from the gain setup threshold is reached. This effectively moves the corner of the CTF 108 to −3 dB below the passband indicated as ADC corner trim threshold in FIG. 2B.

Figure 3:
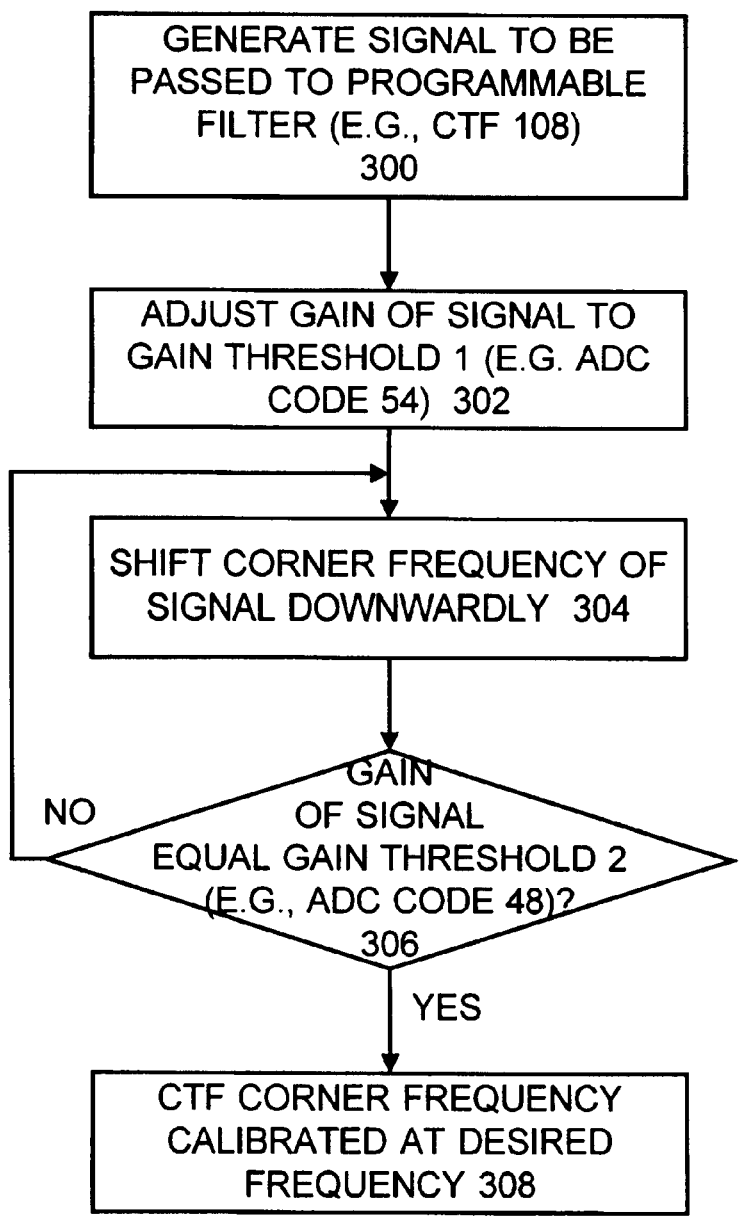
FIGS. 3, 4, 5, 6, 7, and 8 are flow charts illustrating exemplary sequential steps for calibrating a corner frequency of a tunable filter in accordance with the preferred embodiment.

Referring to FIG. 3, there are shown exemplary steps for calibrating a corner frequency of CTF 108 in accordance with the preferred embodiment. A signal to be passed to the programmable filter, for example, CTF 108 is generated as indicated in a block 300. The signal is a peak-detectable signal, such as a sinusoidal signal and is generated to have a frequency equal to a target corner frequency within the pass band of CTF 108 with the CFC bits set to maximum. The gain of the signal is adjusted to a gain threshold 1, for example with an ADC code 54 until the ADC code reach the user programmed ADC gain setup threshold as illustrated in FIG. 2A as indicated in a block 302. Next, the corner frequency of the signal is shifted downwardly until the gain of the signal equals a gain threshold 2, for example with an ADC code 48 as indicated in a blocks 304 and 306. When the gain of the signal equals the gain threshold 2, the corner frequency of CTF 108 is calibrated at the desired frequency as indicated in a block 308.

Figure 4:
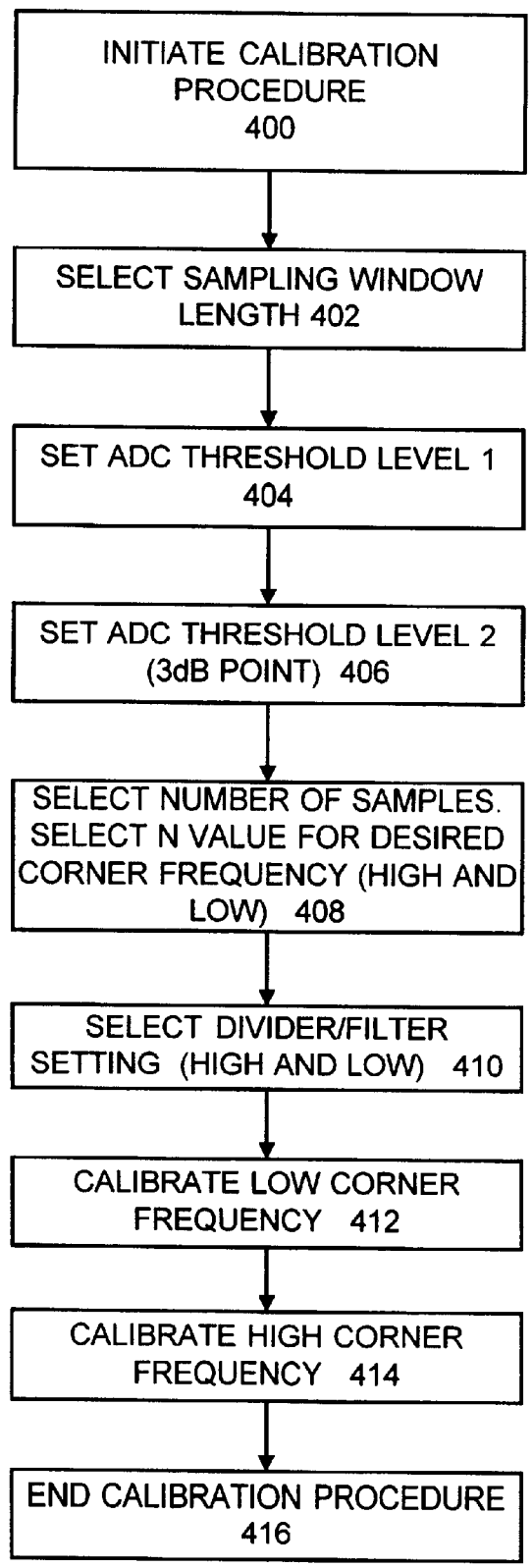

Referring to FIG. 4, there are shown exemplary steps for calibrating a low and a high corner frequency of CTF 108 in accordance with the preferred embodiment. The sequential steps start with initiating the calibration procedure as indicated in a block 400. Optionally a user selected sampling window length 130 or predefined sampling window length 130 is set as indicated in a block 402. Next the ADC threshold level 1 or gain setup ADC threshold level 132 is set, such as ADC code 54, as indicated in a block 404. The ADC threshold level 2 or corner trim ADC threshold level 134 is set, such as ADC code 48, as indicated in a block 406. Then optionally the number of samples 136 and the N value for desired corner frequency, high and low, are selected as indicated in a block 408. Otherwise predefined values for the number of samples 136 and the N value for desired corner frequency, high and low, are loaded. The divider/filter selection 140 is selected as indicated in a block 410. Then the low corner frequency is calibrated as indicated in a block 412. The high low corner frequency is calibrated as indicated in a block 414. The calibration procedure ends as indicated in a block 416.

Figure 5:
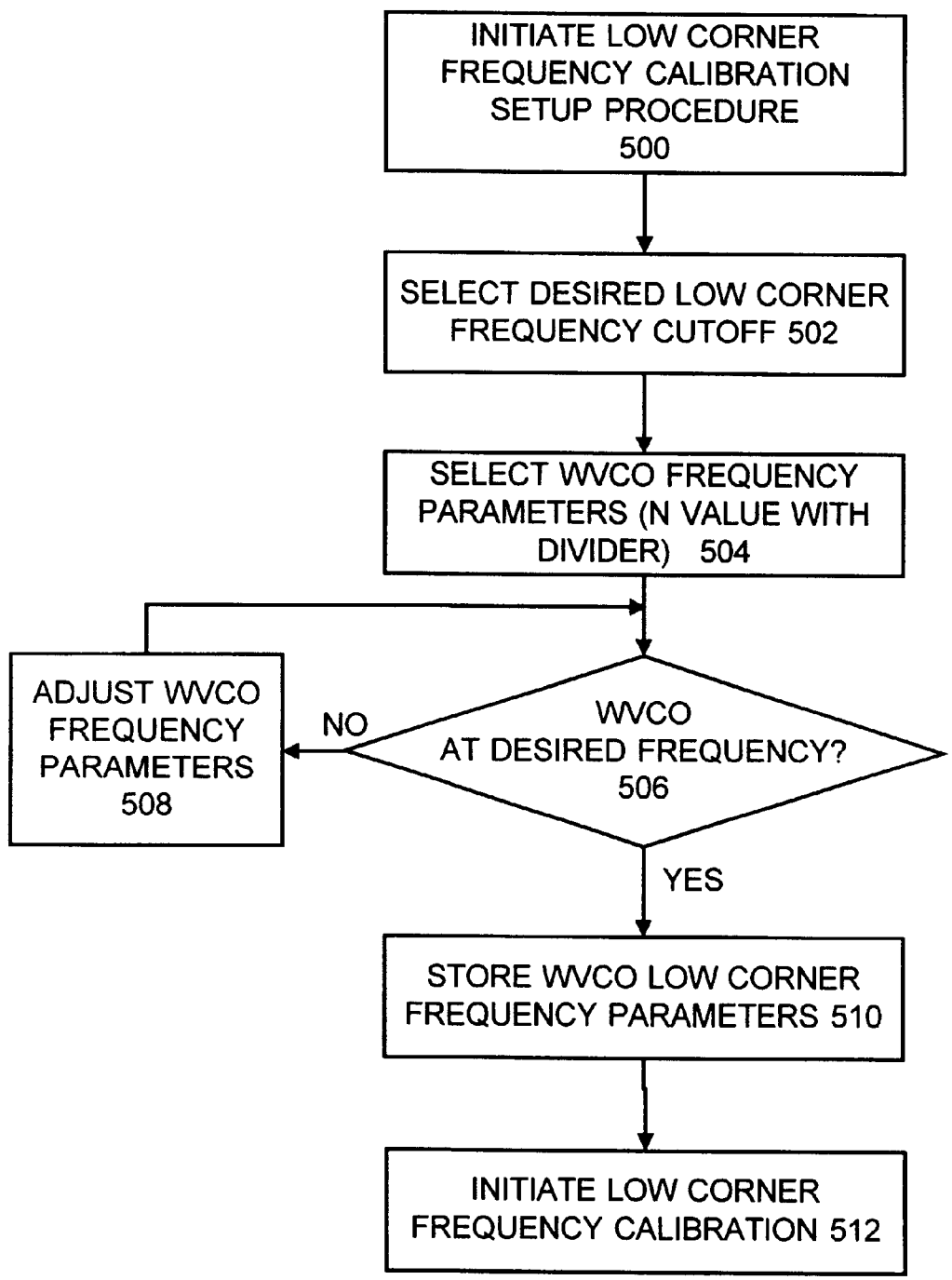

Referring to FIG. 5, there are shown exemplary steps for calibration setup procedure of the low corner frequency of CTF 108 in accordance with the preferred embodiment. The low corner frequency calibration setup procedure is initiated as indicated in a block 500. A desired low corner frequency cutoff is selected as indicated in a block 502. WVCO frequency parameters are selected as indicated in a block 504 including a proper N value with divider for the desired corner frequency is determined. Checking for the WVCO at the desired frequency is performed as indicated in a decision block 506. The WVCO frequency parameters are adjusted as indicated in a block 508 until the WVCO reaches the desired frequency identified at decision block 506. The WVCO low corner frequency parameters are stored as indicated in a block 510. The low corner frequency calibration is initiated as indicated in a block 512.

Figure 6:
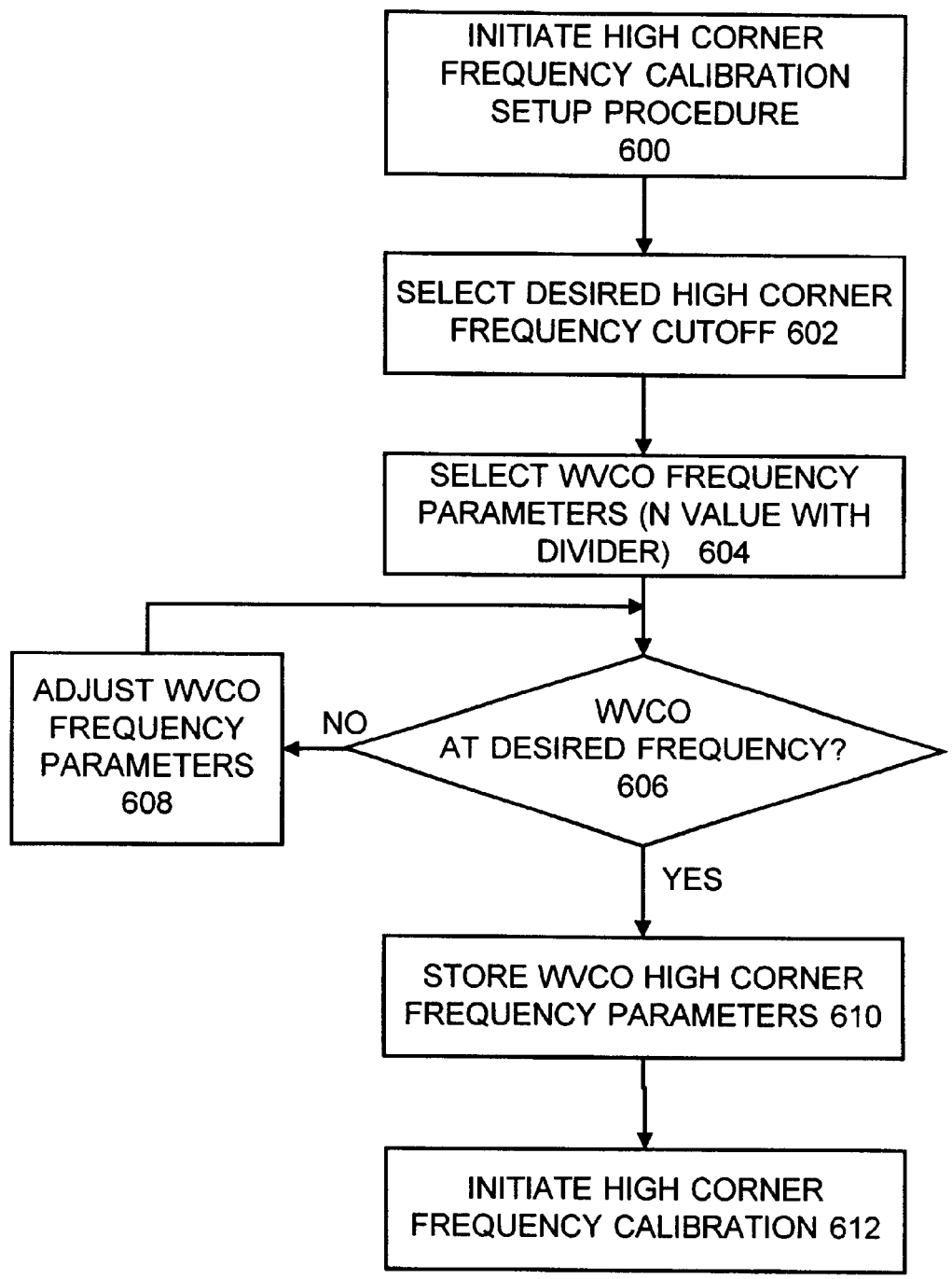

Referring to FIG. 6, there are shown exemplary steps for calibration setup procedure of the high corner frequency of CTF 108 in accordance with the preferred embodiment. The high corner frequency calibration setup procedure is initiated as indicated in a block 600. A desired high corner frequency cutoff is selected as indicated in a block 602. WVCO frequency parameters are selected as indicated in a block 604 including a proper N value with divider for the desired corner frequency is determined. Checking for the WVCO at the desired frequency is performed as indicated in a decision block 606. The WVCO frequency parameters are adjusted as indicated in a block 608 until the WVCO reaches the desired frequency identified at decision block 606. The WVCO high corner frequency parameters are stored as indicated in a block 610. The high corner frequency calibration is initiated as indicated in a block 612.

Figure 7:
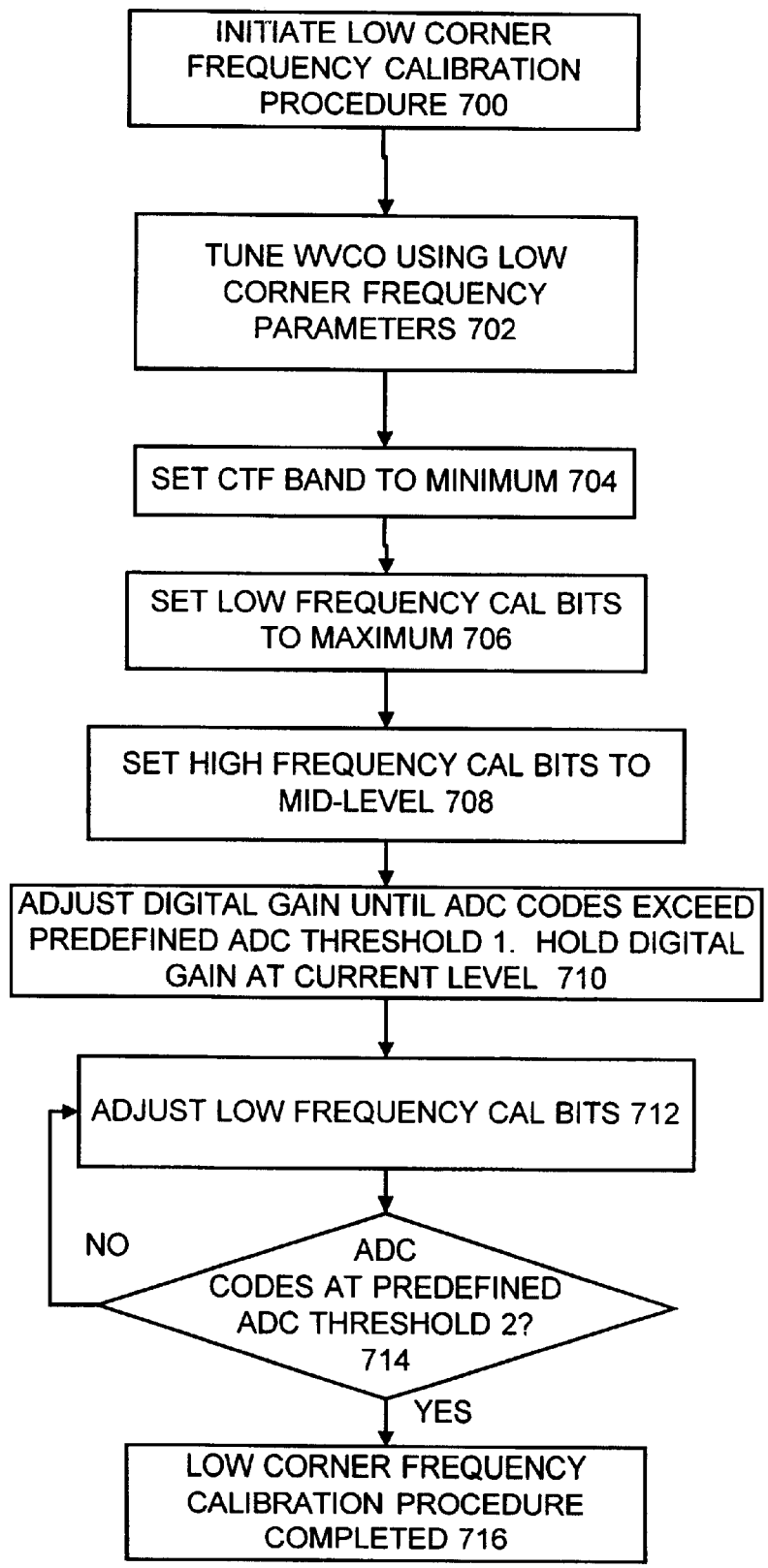

Referring to FIG. 7, there are shown exemplary steps for calibrating the low corner frequency of CTF 108 in accordance with the preferred embodiment. The low corner frequency calibration procedure of CTF 108 occurs automatically without user intervention after the calibration setup. procedure of the low corner frequency of CTF 108 of FIG. 5. The low corner frequency calibration procedure of CTF 108 is initiated as indicated in a block 700. The WVCO 114 is tuned using the low corner frequency parameters as indicated in a block 702. The CTF band is set to minimum as indicated in a block 704. The low frequency cutoff adjust bits, cal bits input to CTF 108 are set to maximum as indicated in a block 706. The high frequency cal bits input to CTF 108 is set to a mid-level setting as indicated in a block 708. The digital gain is adjusted by the calibrate CFC control logic 102 via the digital gain control converter 124 until the ADC codes exceed the predefined ADC threshold 1 and the digital gain is then held at the current level as indicated in a block 710. The low frequency cal bits are adjusted until the ADC codes reach the predefined ADC threshold 2 as indicated in blocks 712 and 714. When the ADC codes reach the predefined ADC threshold 2, the low corner frequency calibration procedure is completed as indicated in a block 716.

Figure 8:
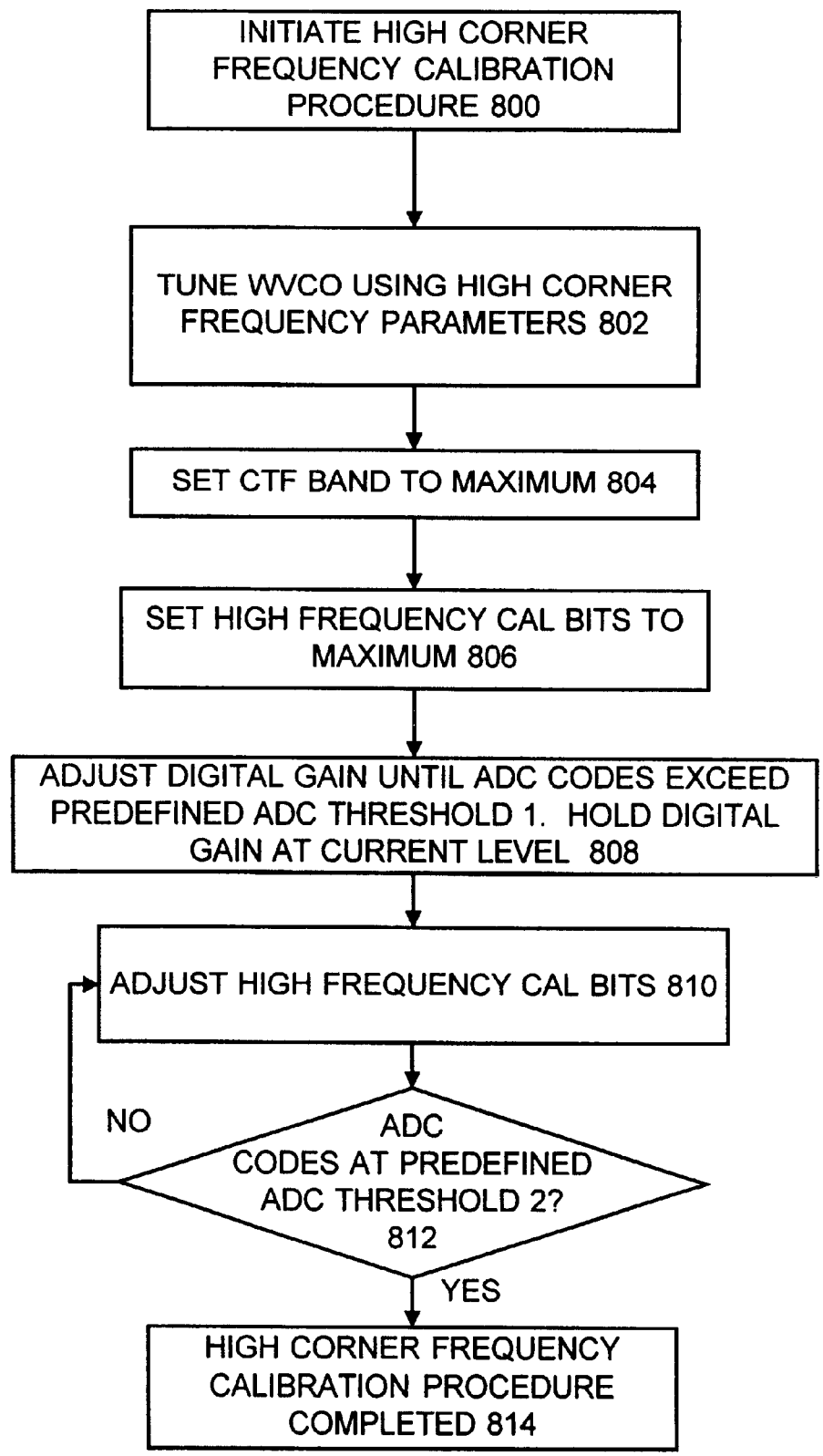

Referring to FIG. 8, there are shown exemplary steps for calibrating the high corner frequency of CTF 108 in accordance with the preferred embodiment. The high corner frequency calibration procedure of CTF 108 occurs automatically without user intervention after the calibration setup procedure of the high corner frequency of CTF 108 of FIG. 6. The high corner frequency calibration procedure of CTF 108 is initiated as indicated in a block 800. The WVCO 114 is tuned using the high corner frequency parameters as indicated in a block 802. The CTF band is set to minimum as indicated in a block 804. The high frequency cutoff adjust bits, cal bits input to CTF 108 are set to maximum as indicated in a block 806. The high frequency cal bits input to CTF 108 is set to a mid-level setting as indicated in a block 808. The digital gain is adjusted by the calibrate CFC control logic 102 via the digital gain control converter 124 until the ADC codes exceed the predefined ADC threshold 1 and the digital gain is then held at the current level as indicated in a block 810. The high frequency cal bits are adjusted until the ADC codes reach the predefined ADC threshold 2 as indicated in blocks 812 and 814. When the ADC codes reach the predefined ADC threshold 2, the high corner frequency calibration procedure is completed as indicated in a block 816.

While the present invention has been described with reference to the details of the embodiments of the invention shown in the drawing, these details are not intended to limit the scope of the invention as claimed in the appended claims.

What is claimed is:

1. A method for calibrating a corner frequency of a tunable filter in a direct access storage device comprising the steps of:

generating a signal having a frequency within a pass band of the tunable filter to be passed to the tunable filter;

producing a digitized signal responsive to said signal from said tunable filter using an analog-to-digital converter (ADC) coupled to the tunable filter;

adjusting a gain of said signal using a variable gain amplifier coupling said generated signal to the tunable filter until a first ADC gain setup threshold level is reached; and adjusting calibration bits controlling the corner frequency of the tunable filter until a second ADC gain threshold level is reached, whereby the corner frequency of the tunable filter is calibrated at a desired frequency.

2. A method for calibrating a corner frequency of a tunable filter in a direct access storage device as recited in claim 1 wherein the step of generating a signal having a frequency within a pass band of the tunable filter to be passed to the tunable filter includes the step of tuning a write voltage controlled oscillator (WVCO) using a user input value to setup a desired WVCO frequency.

3. A method for calibrating a corner frequency of a tunable filter in a direct access storage device as recited in claim 1 wherein the step of adjusting a gain of said signal until a first ADC gain setup threshold level is reached further includes the step of holding said adjusted gain of said signal.

4. A method for calibrating a corner frequency of a tunable filter in a direct access storage device as recited in claim 1 wherein the step of adjusting a gain of said signal until a first ADC gain setup threshold level is reached includes the step of adjusting a gain of said signal until a predefined first ADC code is reached at said first ADC gain setup threshold level.

5. A method for calibrating a corner frequency of a tunable filter in a direct access storage device as recited in claim 4 further includes the step of holding said adjusted gain of said signal and wherein said predefined first ADC code is a user input value.

6. A method for calibrating a corner frequency of a tunable filter in a direct access storage device as recited in claim 1 includes the step of adjusting said calibration bits applied to the tunable filter until a predefined second ADC code is reached at said second ADC gain threshold level.

7. A method for calibrating a corner frequency of a tunable filter in a direct access storage device as recited in claim 6 wherein said predefined second ADC code is a user input value.

8. A method for calibrating a corner frequency of a tunable filter in a direct access storage device as recited in claim 1 wherein said second ADC gain threshold level is a predefined value less than said first ADC gain setup threshold level.

9. A method for calibrating a corner frequency of a tunable filter in a direct access storage device as recited in claim 1 wherein the step adjusting calibration bits controlling the corner frequency of the tunable filter until the second ADC gain threshold level is reached includes the step of holding said adjusted gain of said signal.

10. A method for calibrating a corner frequency of a tunable filter in a direct access storage device as recited in claim 1 wherein the corner frequency of the tunable filter is a low corner frequency or a high corner frequency.

11. A system for calibrating a corner frequency of a tunable filter in a direct access storage device comprising:

calibrate control logic coupled to the tunable filter;

a signal source generating a signal having a frequency within a pass band of the tunable filter to be passed to the tunable filter;

a variable gain amplifier coupled to said signal source and coupled to the tunable filter;

an analog-to-digital converter (ADC) coupled to the tunable filter, said ADC producing a digitized signal responsive to receiving the signal from the filter;

said calibrate control logic coupled to said variable gain amplifier and said ADC and said calibrate control logic adjusting a gain of said signal until a first ADC gain setup threshold level is reached; and said calibrate control logic adjusting calibration bits controlling the corner frequency of the tunable filter until a second ADC gain threshold level is reached, whereby the corner frequency of the tunable filter is calibrated at a desired frequency.

12. A system for calibrating a corner frequency of a tunable filter in a direct access storage device as recited in claim 11 wherein said signal source includes a signal translator, a sequencer coupled to a signal translator; and said sequencer having servo inputs coupled to a servo voltage controlled oscillator and having data inputs coupled to a write voltage controlled oscillator.

13. A system for calibrating a corner frequency of a tunable filter in a direct access storage device as recited in claim 11 includes a digital gain control converter coupled to said variable gain amplifier, said digital gain control converter providing control signals to said variable gain amplifier responsive to control signals received from said calibrate control logic.

14. A system for calibrating a corner frequency of a tunable filter in a direct access storage device as recited in claim 11 wherein said first ADC gain setup threshold level corresponds to a first ADC code and said second ADC gain threshold level corresponds to a second ADC code.

15. A system for calibrating a corner frequency of a tunable filter in a direct access storage device as recited in claim 11 wherein said first ADC code and said second ADC code are user input values.

16. A system for calibrating a corner frequency of a tunable filter in a direct access storage device as recited in claim 11 wherein the corner frequency of the tunable filter is a low corner frequency or a high corner frequency.

* * * * *